United States Patent [19]

Takeda et al.

[11] Patent Number: 4,933,573

[45] Date of Patent: Jun. 12, 1990

[54] SEMICONDUCTOR INTEGRATED CIRCUIT

[75] Inventors: Hisao Takeda; Naoto Fujishima, both of Matsumoto, Japan

[73] Assignee: Fuji Electric Co., Ltd., Kawasaki, Japan

[21] Appl. No.: 244,918

[22] Filed: Sep. 14, 1988

[30] Foreign Application Priority Data

Sep. 18, 1987 [JP] Japan .................................. 62-233988
Sep. 18, 1987 [JP] Japan .................................. 62-233989

[51] Int. Cl.$^5$ ........................ H03K 3/01; H03K 3/26
[52] U.S. Cl. .................................. 307/296.2; 357/48; 307/303
[58] Field of Search ................ 307/296.2, 303; 357/48

[56] References Cited

U.S. PATENT DOCUMENTS

| | | | |
|---|---|---|---|
| 3,541,357 | 11/1970 | Kram | 357/40 |
| 4,208,595 | 6/1980 | Gladstein et al. | 307/296.6 |
| 4,377,756 | 3/1983 | Yoshihara et al. | 307/296.1 |
| 4,455,493 | 6/1984 | Morton et al. | 307/304 |
| 4,496,849 | 1/1985 | Kotowski | 357/48 |
| 4,559,548 | 12/1985 | Iizuka et al. | 357/42 |
| 4,571,505 | 2/1986 | Eaton, Jr. | 307/579 |
| 4,581,547 | 4/1986 | Bynum et al. | 357/44 |

OTHER PUBLICATIONS

"Basic Integrated Circuit Engineering", by Hamilton et al., McGraw Hill, 1975, pp. 24-25.

Primary Examiner—Stanley D. Miller
Assistant Examiner—Richard Roseen
Attorney, Agent, or Firm—Brumbaugh, Graves, Donohue & Raymond

[57] ABSTRACT

An improved semiconductor integrated circuit included in electrical equipment for recharging and discharging a load capacitor with alternating current and which includes differentiating circuits inherently formed in the integrated circuit and whose devices are formed on a P-type substrate and are isolated from each other by PN junction isolation. The substrate of the integrated circuit is electrically isolated from any grounding electrodes and is connected to a negative voltage source.

8 Claims, 2 Drawing Sheets

SEMICONDUCTOR INTEGRATED CIRCUIT

BACKGROUND OF THE INVENTION

The present invention relates to a semiconductor integrated circuit having its devices formed on a substrate and isolated from each other by PN junction isolation which is used, for example, to drive alternating-current plasma displays, and which is included in electrical equipment for recharging and discharging a load capacitor with alternating current to eliminate parasitic currents induced in the differentiating circuits inherently formed in the recharging and discharging equipment.

Flat-panel displays such as alternating-current plasma-display panels and alternating-current electroluminescent displays are examples of newly developed electrical devices that use such an integrated circuit. The circuit of this display can be equivalently represented as a capacitor and is shown as a load capacitor 10 in FIG. 1. The recharging and discharging of this capacitor is controlled by two symmetrically configured driving integrated circuits 1, 2 via output terminals 15, 25. This process curtails the power consumed by the whole system, improves the image quality, enhances the reliability and reduces the cost.

One circuit consists mainly of a high-level output transistor 11, a low-level output transistor 12, a high-level diode 13, and a low-level diode 14 while the other consists primarily of a high-level output transistor 21, a low-level output transistor 22, a high-level diode 23, and a low-level diode 24. The integrated circuit 1 for driving the X-electrodes includes a control circuit 6 having a low-voltage power terminal 61, an input terminal 62, a data input terminal 63, and a clock terminal 64. The integrated circuit 2 for driving the Y-electrodes includes a control circuit 7 having a low-voltage power terminal 71, an input terminal 72, a data input terminal 73, and a clock terminal 74. In the integrated circuit 1, a high-voltage power terminal 18 is connected with the control circuit 6, the collector of the high-level output transistor 11, and the cathode of the high-level diode 13. The grounding terminal 19 is connected with the control circuit 6, the emitter of the low-level output transistor 12, and the anode of the low-level diode 14. As used herein, the terms "grounding terminal", "grounding electrode" and "reference potential electrode" refer interchangeably to internal ground or reference potential within the circuit being addressed. Similarly, in the integrated circuit 2, a high-voltage power terminal 28 is connected with the control circuit 7, the collector of the high-level output transistor 21, and the cathode of the high-level diode 23. The grounding terminal 29 is connected with the control circuit 7, the emitter of the low-level output transistor 22, and the anode of the low-level diode 24.

Referring still to FIG. 1, when the transistor 12 is caused to conduct for discharging the load capacitor 10 through the grounding terminals 19, 29, the closed loop consisting of the components 10, 15, 12, 19, 29, 24, 25, 10 forms a differentiating circuit. Therefore, the potential at the output terminal 25 of the integrated circuit 2 for driving the Y-electrodes becomes lower than the potential at the grounding terminal 29. Likewise, the potential at the output terminal 15 of the integrated circuit 1 for driving the X-electrodes can drop below the potential at the grounding terminal 19. Parasitic elements inherently formed in the integrated circuits cause parasitic currents which may be wastefully consumed as parasitic collector current, for example, from the adjacent device. Parasitic currents of this kind add to power loss and detract from the function of the system and furthermore, they may cause latch-up.

FIG. 2 shows the fundamental structure of such a semiconductor circuit employing PN junction isolation. This circuit has a P-type silicon substrate 31 on which an N-type epitaxial layer 32 is formed. NPN bipolar transistors are formed in the epitaxial layer 32. The collector of each NPN bipolar transistor is formed by an N-type collector diffusion layer 34 and the epitaxial layer 32, the diffusion layer 34 being connected to an N-type buried diffusion layer 33. P layers 35 are formed in the epitaxial layer 32. Each P layer 35 forms the base of each NPN bipolar transistor. $N^+$ layers 36 are also formed in the epitaxial layer 32. Each $N^+$ layer 36 forms the emitter of each NPN bipolar transistor. An oxide film 38 is provided with holes through which aluminum collector electrodes 41 and base electrodes 42 contact the collector layers 34 and the base layers 35, respectively. A grounding electrode 4 is in contact with each emitter layer 36.

The semiconductor region in which one transistor is formed is electrically isolated from the other semiconductor regions by the PN junction between the P-type substrate 31 and the epitaxial layer 32, the PN junction between the substrate 31 and the collector layer 33, and the PN junction between a P-type diffusion layer 37 and the N-type epitaxial layer 32. The diffusion layer 37 extends into the substrate 31 from the surface of the epitaxial layer 32. This isolation in the integrated circuit is called PN junction isolation. Each diode region has an anode 43 formed in the P layer 35 and a cathode 44 which is in contact with one of the corresponding $N^+$ layers 36 in the N layer 32. The diode regions are also isolated from each other by the PN junctions between the N layer 32 and the P layers 35 formed in it.

The various parasitic elements formed in this integrated circuit are shown in FIG. 3 in dotted line portion. The operation of this semiconductor integrated circuit is controlled by a control circuit 50 having two output transistors 45, 46, a Zener diode 47, and input control terminals 48, 49. An input voltage is applied between a grounding terminal 51 and an input terminal 52 so that an output may appear between a terminal 53 on a grounded substrate and an output terminal 54. Parasitic diodes 55 due to the PN junction between the P-type substrate 31 and each $N^+$ layer 33, as shown in FIG. 2, parasitic capacitances 56, and a parasitic NPN bipolar transistor 57 are formed in this circuit. The base of each parasitic transistor 57 is formed by the P-type substrate 31 built into the two transistors 45, 46. The collector and the emitter of each parasitic transistor 57 are formed by the N-type collector layers of both transistors. Therefore, the grounding terminal 51 of the power supply of the control circuit is placed at the same potential as the junction isolation substrate 31 via the $P^+$ isolating layers 37 which are in contact with the grounding electrode 4 inside the holes 39 as shown in FIG. 2, in order to always reverse-bias the PN junctions for reducing the parasitic effects of the parasitic elements.

When the potential at the output terminal 54 shown in FIG. 3 becomes lower than the potential at the grounding terminal 53, it substantially follows that a forward current flows into the parasitic diodes 55. This forward current flows into the base of the parasitic PNP transistor and is wastefully consumed.

It is an object of the invention to provide a semiconductor integrated circuit which is free from the foregoing problems, prevents its differentiating circuits from hindering PN junction isolation by keeping parasitic currents from flowing, reduces the power loss of the whole system, is capable of high-speed operation, and is highly resistant to noise.

SUMMARY OF THE INVENTION

The above object is achieved by a semiconductor integrated circuit included in electrical equipment for recharging and discharging a load capacitor with alternating current and which includes differentiating circuits inherently formed in the integrated circuit and whose devices are formed on a P-type substrate and are isolated from each other by PN junction isolation. The substrate of the integrated circuit is electrically isolated from any grounding electrodes and is connected to a negative voltage source.

In one preferred embodiment of the invention, the substrate has other terminals that are connected to a negative voltage source.

In another preferred embodiment of the invention, the integrated circuit includes differentiating circuits, rectifying circuits, recharging circuits, a P-type substrate electrically isolated from grounding electrodes, and a negative voltage generator circuit that is connected to a switching regulated power supply and which produces a negative voltage and applies it to the substrate. At least the differentiating circuits and the rectifying circuits are formed in the same semiconductor together with other circuits.

The junction isolation P-type substrate of the integrated circuit is electrically isolated from ground potential and is connected with the negative voltage source to make the potential at the substrate lower than the negative potential produced in the N-type semiconductor regions by the inherently formed differentiating circuits. Thus, a reverse bias can be maintained across the PN junctions.

DESCRIPTION OF THE PREFERRED EMBODIMENTS

Figure 1:
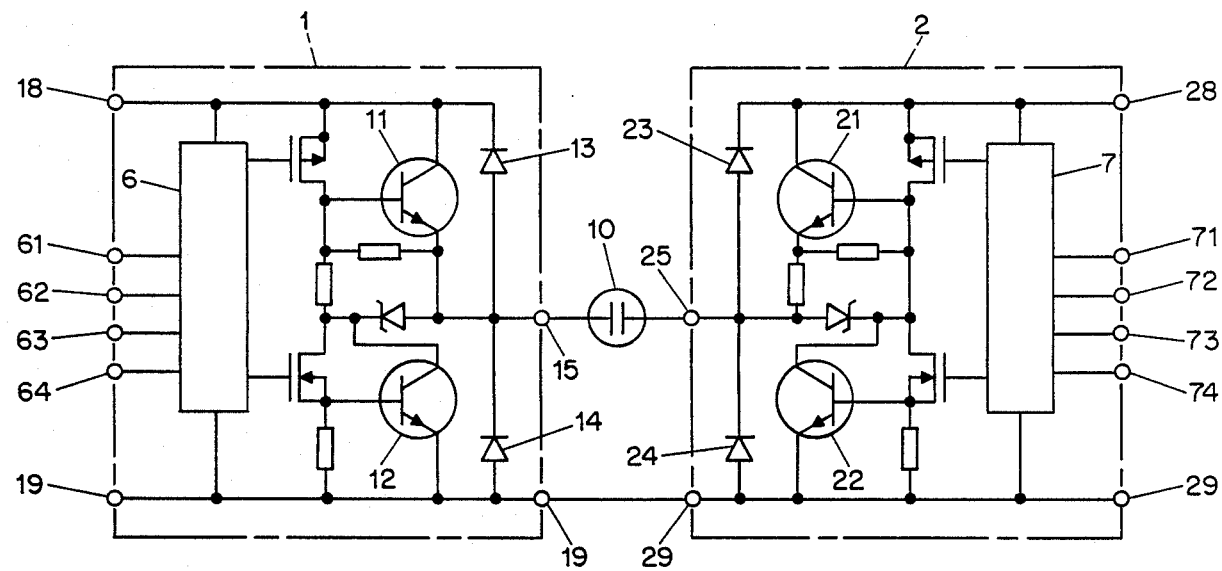
FIG. 1 is an equivalent circuit diagram of the prior art charging circuits.
Figure 4:
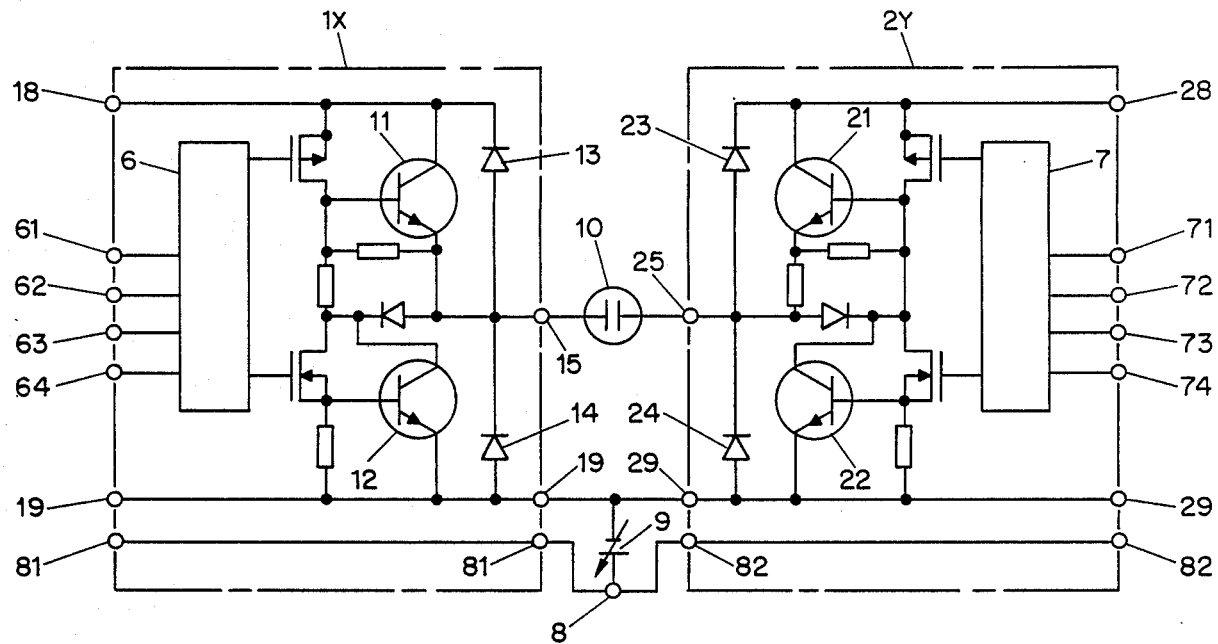
FIG. 4 is an equivalent circuit diagram of electrical equipment according to the invention.

FIG. 4 shows an equivalent circuit of one example of the invention. It should be noted that like components are denoted by like reference numerals in both FIGS. 1 and 4. A cell 10 forming a pixel is represented by a load capacitor in the same way as in the circuit shown in FIG. 1. An integrated circuit 1 for driving X-electrodes controls recharging and discharging of the cell and has an X output terminal 15. Another integrated circuit 2 for driving Y-electrodes also controls recharging and discharging of the cell and has a Y output cell 25. The cell 10 is connected with the output terminals 15 and 25, which are connected with high voltage power terminals 18 and 28 via high-level output transistors 11 and 21, respectively. The output terminals 15 and 25 are also connected with grounding terminals 19 and 29, respectively, via low-level output transistors 12 and 22. High-level diodes 13 and 23 are connected on the high-voltage side of the load capacitor 10 to discharge it. The diodes 13 and 23 are connected with the power terminals 18 and 28 in parallel with the transistors 11 and 21. Low-level diodes 14 and 24 which act as discharging devices on the grounded side are connected with the grounding terminals 19 and 29, respectively, in parallel with the transistors 12 and 22, respectively.

Figure 2:
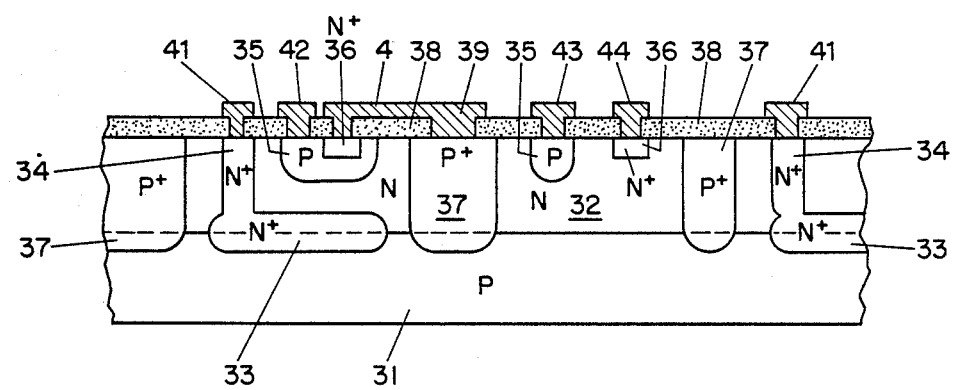
FIG. 2 is a cross-sectional view of a conventional junction isolation integrated circuit.
Figure 3:
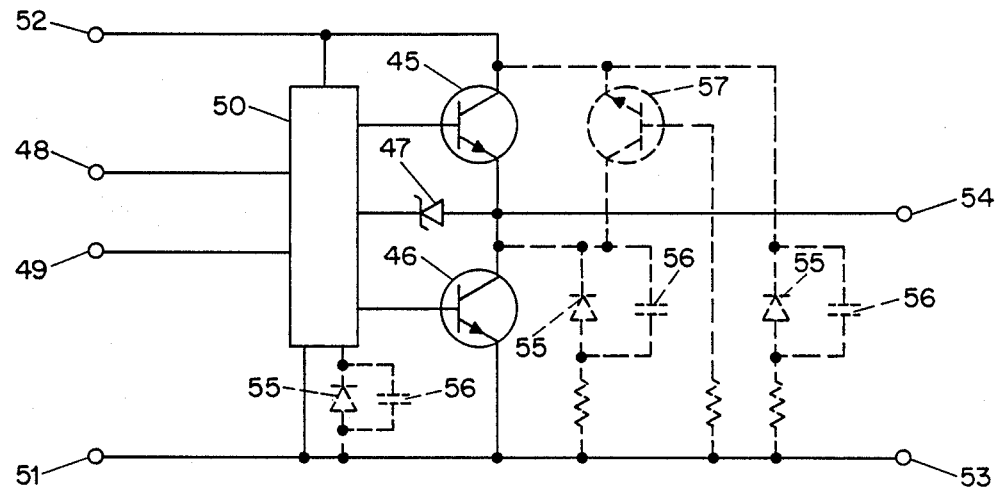
FIG. 3 is a parasitic equivalent circuit diagram of the integrated circuit shown in FIG. 2.

In the past, as shown in FIG. 2, the grounding terminals 4 were connected with the substrate 31 via the isolating layers 37 which were in contact with the terminals inside the holes in the oxide film 38. On the other hand, in the present example, the grounding electrodes on the surface of the integrated circuit are electrically isolated from such isolating layers. Terminals 81 and 82 are formed on the substrates of the integrated circuits 1 and 2, respectively. Where both substrates are separate, a terminal 8 is connected with the terminals 81 and 82. Where both substrates are integral, the terminal 8 is formed on the integral substrate itself. A variable voltage DC power supply 9 serving as a negative voltage source is connected between the terminal 8 and the junction of the grounding terminals 19 and 29. The potential at the substrate which is determined by the negative voltage source 9 is set to the lowest value in the equipment to prevent the parasitic diodes, the parasitic capacitances, and the parasitic thyristors formed between the substrate and the devices from adversely affecting the operation of the electrical equipment. In the case of an alternating-current plasma display, the output terminal 15 or 25 assumes a potential of about $-3V$ when it is discharged and, therefore, the potentials at the substrate terminals 8, 81, 82 are preferably set lower than about $-5V$. The negative voltage source 9 can be built into the integrated circuit and connected to the terminal 8 on the substrate.

Figure 5A:
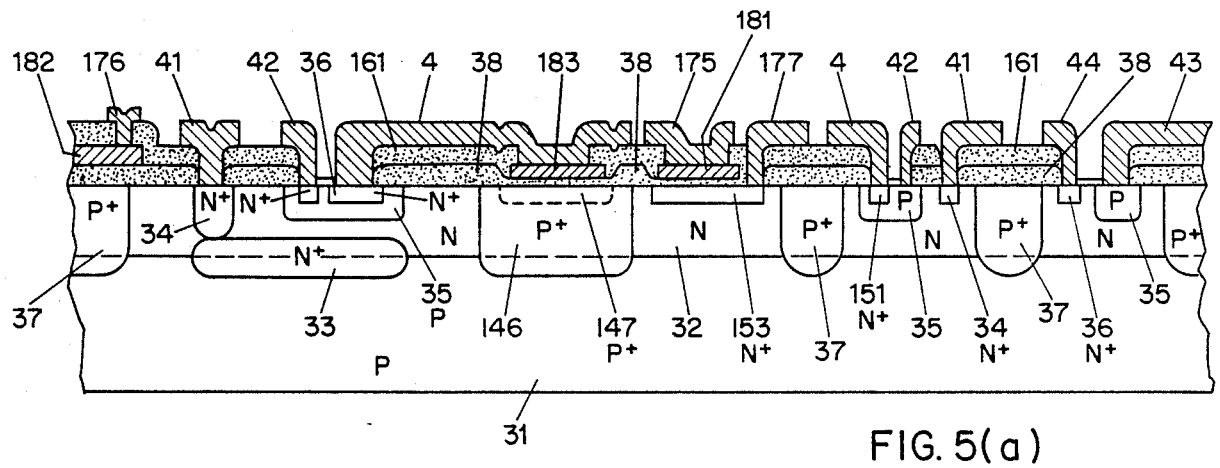
FIG. 5(a) is a cross-sectional view of main portions of another integrated circuit according to the invention and FIG. 5(b) is an equivalent circuit diagram of the circuit shown in FIG. 5(a).
Figure 5B:
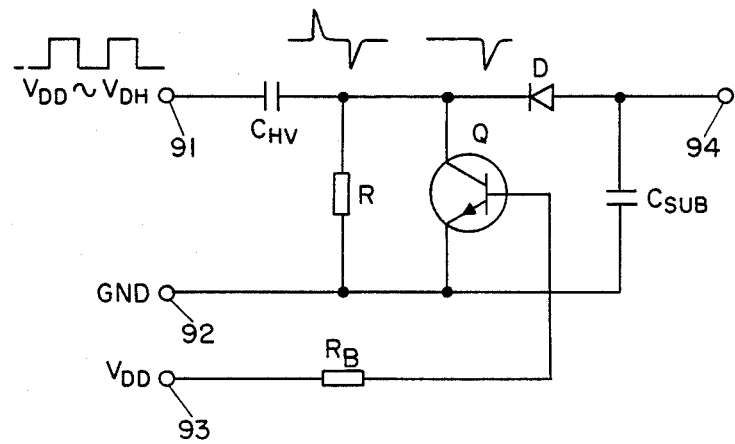

FIG. 5(a) is a cross section of a portion of another semiconductor integrated circuit according to the invention. Like components are indicated by like reference numerals in both FIGS. 2 and 5(a). FIG. 5(b) shows an equivalent circuit of the integrated circuit. The surface of a P-type silicon substrate 31 has a specific resistance of 25 to 35 $\Omega$/cm. An N-type epitaxial layer 32 having a specific resistance of 8 $\Omega$/cm is formed on the substrate 31. In the same manner as the circuit shown in FIG. 2, NPN bipolar transistors are formed in and over the epitaxial layer 32 by N-type collector diffusion layers 34, P layers 35, and N+ layers 151. The diffusion layers 34 are coupled to N-type buried diffusion layers 33. These transistors are used as output transistors. Grounding electrodes 4, collector electrodes 41, and base electrodes 42 are all made from an Al-Si alloy. An oxide film 38 is formed on the epitaxial layer 32. Double layers 161 of low-temperature oxide (LTO) and phosphosilicate glass (PSG) are formed on the oxide film 38. The double layers 161 are provided with holes. The electrodes 4, 41, 42 are in contact with the epitaxial layer inside the holes. The grounding electrodes 4 that are in contact with isolating layers 37 are isolated from the substrate 31 by the oxide film 38. N+ layers 153 are formed in the N layer 32. Polysilicon layers 181, doped via the oxide film 38, are formed on the N+ layers 153. Al-Si electrodes 175 are in contact with the polysilicon layers 181. Electrodes 177 are connected with N+ layers 153. Thus capacitors are formed. Each capacitor is illustrated by $C_{HV}$ in FIG. 5(b), and connected with either a constant voltage source $V_{DD}$ for supplying clock pulses or a high-voltage source $V_{DH}$ via a terminal 91. A resistor is formed by the polysilicon layer 182 on the oxide film 38, as partially shown at the left end of FIG. 5(a). One electrode, such as an electrode 176, of this resistor is connected with the capacitor via a lead wire, while the other electrode is tied to a grounding terminal 92. This resistor corresponds to the resistor R shown in FIG. 5(b). P+ isolation layers are formed under the resistor layers 182. An NPN bipolar transistor similar in structure to the output transistors, except for the buried layer 33, is formed in the N layer 32 and is surrounded by the isolation layer 37 that is to the right of the region where the capacitor $C_{HV}$ is formed. This transistor corresponds to transistor Q shown in FIG. 5(b), and is biased on by a base current supplied from a constant voltage source terminal 93 via a resistor $R_B$. A differentiating circuit is formed by $C_{HV}$ and R and produces a differentiated waveform as shown. The conducting transistor produces a rectified waveform from the differentiated waveform. P layers 35 and N+ layers 36 are formed in the region of the N layer 32 which are separated from the transistors by the isolation layers 37. Similarly to the circuit shown in FIG. 2, diodes having anodes 43 and cathodes 44 are formed. The anodes 43 and the cathodes 44 are in contact with the P layers 35 and the N layers 36, respectively. Each diode is expressed by D in FIG. 5(b). The diode has a terminal 94 connected with the anode 43.

As an example, a negative voltage of $-3V$ or $-5V$ appears at the terminal 94 except when the rectified waveform goes positive. The negative voltage is applied to the P+ layers 147 which are formed on P-type isolation diffusion layers 146 connected with the grounding electrodes 4 via polysilicon layers 183 and the oxide films 38. Capacitors are formed by the P+ layers 147 and the polysilicon layers 183 between which oxide films 38 are sandwiched. The application of the negative voltage charges one electrode, or the P+ layer, of each capacitor. This capacitor corresponds to $C_{sub}$ shown in FIG. 5(b). The P+ layers 147 are connected to terminals on the substrate 31 via lead wires and electrodes (not shown) having holes. This permits the substrate to be maintained at a negative potential. The connections necessary to constitute the equivalent circuit shown in FIG. 5(b) are made by lead wires (not shown).

The rectifying circuit for each negative voltage generator circuit makes use of the transistor Q and the diode D as shown in FIG. 5(b). The rectifying circuit may be formed only by the transistor Q or only by the diode D, or a diode whose cathode and anode are connected with the terminals 92 and 94, respectively, may be connected in place of the transistor Q. Where the capacitors $C_{sub}$ should have an electrostatic capacity of 1000 to 3000 pF and are difficult to be mounted in the semiconductor, discrete capacitive elements may be externally attached to terminals on the substrate.

We claim:

1. A semiconductor integrated circuit for charging and discharging a load capacitor in response to input signals, and subject to inherent differentiating action producing undesirable forward biasing, comprising:
   (a) a plurality of semiconductor devices formed in and on a substrate, which are isolated from each other by P-N junction isolation and have associated reference potential electrodes;
   (b) first means for electrically isolating said reference potential electrodes from said substrate; and
   (c) second means for providing a reverse bias voltage, said reverse bias voltage being of a magnitude exceeding the effective level of said forward biasing; whereby said reverse bias voltage may be applied between said reference potential electrodes and said substrate to overcome adverse effects of said undesirable forward biasing.

2. A semiconductor integrated circuit according to claim 1 wherein said second means comprises a DC power source.

3. A semiconductor integrated circuit according to claim 1, wherein said second means comprises a battery.

4. A semiconductor integrated circuit for charging and discharging a load capacitor in response to input signals, and subject to inherent differentiating action producing undesirable forward biasing, comprising:
   (a) a plurality of semiconductor devices formed in and on a substrate, which are isolated from each other by P-N junction isolation and have associated reference potential electrodes;
   (b) first means for electrically isolating said reference potential electrodes from said substrate; and
   (c) second means for providing a reverse bias voltage comprising differentiating means responsive to input signals for producing reverse voltage signals and capacitive means coupled to said differentiating means for storing charges representative of said reverse voltage signals to provide said reverse voltage;
   whereby said reverse bias voltage may be applied between said reference potential electrodes and said substrate to overcome adverse effects of said undesirable forward biasing.

5. A semiconductor integrated circuit according to claim 4 wherein said second means further comprises rectifying means coupled to said differentiating means for transferring reverse voltage signals to said capacitive means.

6. A semiconductor integrated circuit according to claim 1 or 4 wherein said substrate is a P-type substrate and said reverse bias voltage provided by said second means is a negative voltage.

7. A semiconductor integrated circuit according to claim 1 or 4 wherein said first means is an oxide film.

8. A semiconductor integrated circuit for charging and discharging a load capacitor in response to input signals, and subject to inherent differentiating action producing undesirable forward biasing, comprising:
   (a) a plurality of semiconductor devices formed in and on a P-type substrate, which are isolated by P-N junction isolation and have associated reference potential electrodes;
   (b) an oxide film isolating said electrodes from said substrate;
   (c) differentiating means responsive to input signals for intentionally producing negative voltage signals;
   (d) rectifying means coupled to said differentiating means for coupling negative voltage signals; and
   (e) capacitive means coupled to said rectifying means for storage charges representative of said negative voltage signals to provide a negative bias;
   whereby said negative bias is usable to overcome adverse effects of said undesirable forward biasing.

* * * * *